US010746356B2

(12) United States Patent
Sano

(10) Patent No.: US 10,746,356 B2
(45) Date of Patent: Aug. 18, 2020

(54) LIGHT EMITTING DEVICE

(71) Applicant: NICHIA CORPORATION, Anan-shi, Tokushima (JP)

(72) Inventor: Masahiko Sano, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/452,445

(22) Filed: Jun. 25, 2019

(65) Prior Publication Data

US 2019/0309912 A1    Oct. 10, 2019

Related U.S. Application Data

(63) Continuation of application No. 15/684,178, filed on Aug. 23, 2017, now Pat. No. 10,359,156.

(30) Foreign Application Priority Data

Aug. 24, 2016    (JP) ................... 2016-163710

(51) Int. Cl.
| | |
|---|---|
| *F21K 9/64* | (2016.01) |
| *H01L 25/075* | (2006.01) |
| *H01L 33/46* | (2010.01) |
| *H01L 33/50* | (2010.01) |
| *F21V 9/30* | (2018.01) |
| *H01L 27/15* | (2006.01) |

(52) U.S. Cl.
CPC ............. *F21K 9/64* (2016.08); *F21V 9/30* (2018.02); *H01L 25/0753* (2013.01); *H01L 27/156* (2013.01); *H01L 33/46* (2013.01); *H01L 33/50* (2013.01)

(58) Field of Classification Search
CPC .......................................................... F21K 9/64
USPC ................. 362/84, 249.02, 249.06, 260, 290
See application file for complete search history.

(56) References Cited

U.S. PATENT DOCUMENTS

2013/0299816 A1* 11/2013 Bessho ................. H01L 27/322
257/40
2013/0329440 A1* 12/2013 Tsutsumi .............. F21S 41/663
362/465
(Continued)

FOREIGN PATENT DOCUMENTS

| JP | 2011-142000 A | 7/2011 |
|---|---|---|
| JP | 2012-019104 A | 1/2012 |

(Continued)

OTHER PUBLICATIONS

Non-Final Office Action on U.S. Appl. No. 15/684,178 dated Sep. 28, 2018.
(Continued)

*Primary Examiner* — Paultep Savusdiphol
(74) *Attorney, Agent, or Firm* — Foley & Lardner LLP

(57) ABSTRACT

A light emitting device includes: a plurality of LEDs arranged in rows and columns; and a wavelength converting member above the plurality of LEDs, the wavelength converting member comprising: a plurality of fluorescent portions arranged in rows and columns, and a light shielding portion between the plurality of fluorescent portions; wherein, in a top view, a first fluorescent portion among the plurality of fluorescent portions overlaps first and second adjacent LEDs among the plurality of LEDs.

12 Claims, 13 Drawing Sheets

(56) References Cited

U.S. PATENT DOCUMENTS

| | | | | |
|---|---|---|---|---|
| 2015/0003040 A1* | 1/2015 | Bessho | ............... | F21V 9/40 |
| | | | | 362/84 |
| 2016/0148912 A1* | 5/2016 | Higashino | ........... | H01L 25/0753 |
| | | | | 257/91 |
| 2016/0351620 A1* | 12/2016 | Tanaka | ................... | H01L 33/50 |

FOREIGN PATENT DOCUMENTS

| | | | |
|---|---|---|---|
| JP | 2012-119407 | A | 6/2012 |
| JP | 2013-021007 | A | 1/2013 |
| JP | 2013-041876 | A | 2/2013 |
| JP | 2013-093459 | A | 5/2013 |
| JP | 2014-220295 | A | 11/2014 |
| JP | 2016-219794 | A | 12/2016 |

OTHER PUBLICATIONS

Notice of Allowance on U.S. Appl. No. 15/684,178 dated Mar. 13, 2019.

\* cited by examiner

LIGHT EMITTING DEVICE

CROSS-REFERENCE TO RELATED PATENT APPLICATIONS

This application is a continuation of U.S. patent application Ser. No. 15/684,178, filed on Aug. 23, 2017, which claims priority to Japanese Patent Application No. 2016-163710, filed on Aug. 24, 2016. The contents of these applications are hereby incorporated by reference in their entireties.

BACKGROUND

The present disclosure relates to a light emitting device.

A light emitting device is known in which a wavelength converting member is disposed above a plurality of light emitting diodes (LEDs) that are arranged in rows and columns on a single substrate (for example, see Japanese unexamined patent publication No. 2012-019104). In such a light emitting device, the wavelength converting member includes a plurality of fluorescent portions also arranged in rows and columns so that each of the plurality of fluorescent portions is located directly above respective one of the LEDs.

SUMMARY

In order to improve light emission intensity and to enable highly precise control of lighting appearance in such light emitting devices, a dense arrangement of the LEDs and a dense arrangement of the fluorescent portions are desired. However, in a light emitting device according to Japanese unexamined patent publication No. 2012-019104, densely arranging the LEDs and also densely arranging the fluorescent portions may lead to a mounting error which affects the positional relationship between the LEDs and the fluorescent portions, at the time of mounting the wavelength converting member. This may result in an uneven number of fluorescent portions located directly above each of the LEDs when viewed from above the plurality of LEDs arranged in rows and columns. That is, while a single LED and a single fluorescent portion in one region may correspond to each other, portions of two or more fluorescent portions may correspond to a single LED in another region. Also, it is relatively difficult to form the fluorescent portions to be the same size, so that sizes of the fluorescent portions may differ in a single wavelength converting member. In this case as well, densely arranging the LEDs and also densely arranging the fluorescent portions may result in an uneven number of fluorescent portions located directly above each of the LEDs when viewed from above the plurality of LEDs arranged in rows and columns. With such an arrangement, the number of the fluorescent portions that emit light when a single LED is turned on and the number of the fluorescent portions that stop emitting light when a single LED is turned off differ according to the locations of the LEDs to be turned on or off, so that it may be difficult to control the lighting appearance in response to turning-on and turning-off pattern of the light emitting device.

In one embodiment of the present disclosure, a light emitting device includes: a substrate, a plurality of LEDs arranged in rows and columns above the substrate, and a wavelength converting member that includes a plurality of fluorescent portions arranged in rows and columns above the plurality of LEDs and a lattice-shaped light-shielding portion arranged between the plurality of the fluorescent portions.

The plurality of LEDs includes rows of LEDs and columns of LEDs. Row-direction spacing regions are respectively arranged between adjacent two of the rows of LEDs, and column-direction spacing regions are respectively arranged between adjacent two of the columns of LEDs. Also, the plurality of fluorescent portions includes rows of fluorescent portions and columns of fluorescent portions, and the lattice-shaped light-shielding portion includes row-direction light-shielding regions extending in a row direction and column-direction light-shielding regions extending in a column direction.

In a top view, that is, when viewed from above the plurality of LEDs arranged in rows and columns, each of the row-direction spacing regions has a width in the column direction smaller than a width of each of the plurality of LEDs in the column direction, and each of the column-direction spacing regions has a width in the row direction smaller than a width of each of the plurality of LEDs in the row direction. Further, in a top view, each of the row-direction light-shielding regions has a width in the column direction smaller than a width of each of the plurality of fluorescent portions in the column direction, and each of the column-direction light-shielding regions has a width in the row direction smaller than a width of each of the plurality of fluorescent portions in the row direction. Also, one or more of the row-direction spacing regions are respectively located directly below a corresponding one of the rows of the fluorescent portions, and one or more of the column-direction spacing regions are respectively located directly below a corresponding one of the columns of the fluorescent portions. Further, one or more of the row-direction light-shielding regions are respectively located directly above a corresponding one of the rows of the LEDs, and one or more of the column-direction light-shielding regions are respectively located directly above a corresponding one of the columns of the LEDs.

With the configuration as described above, a light emitting device of high luminance with highly precise control of lighting appearance in response to turning-on and turning-off pattern can be realized.

DETAILED DESCRIPTION

Figure 1A:
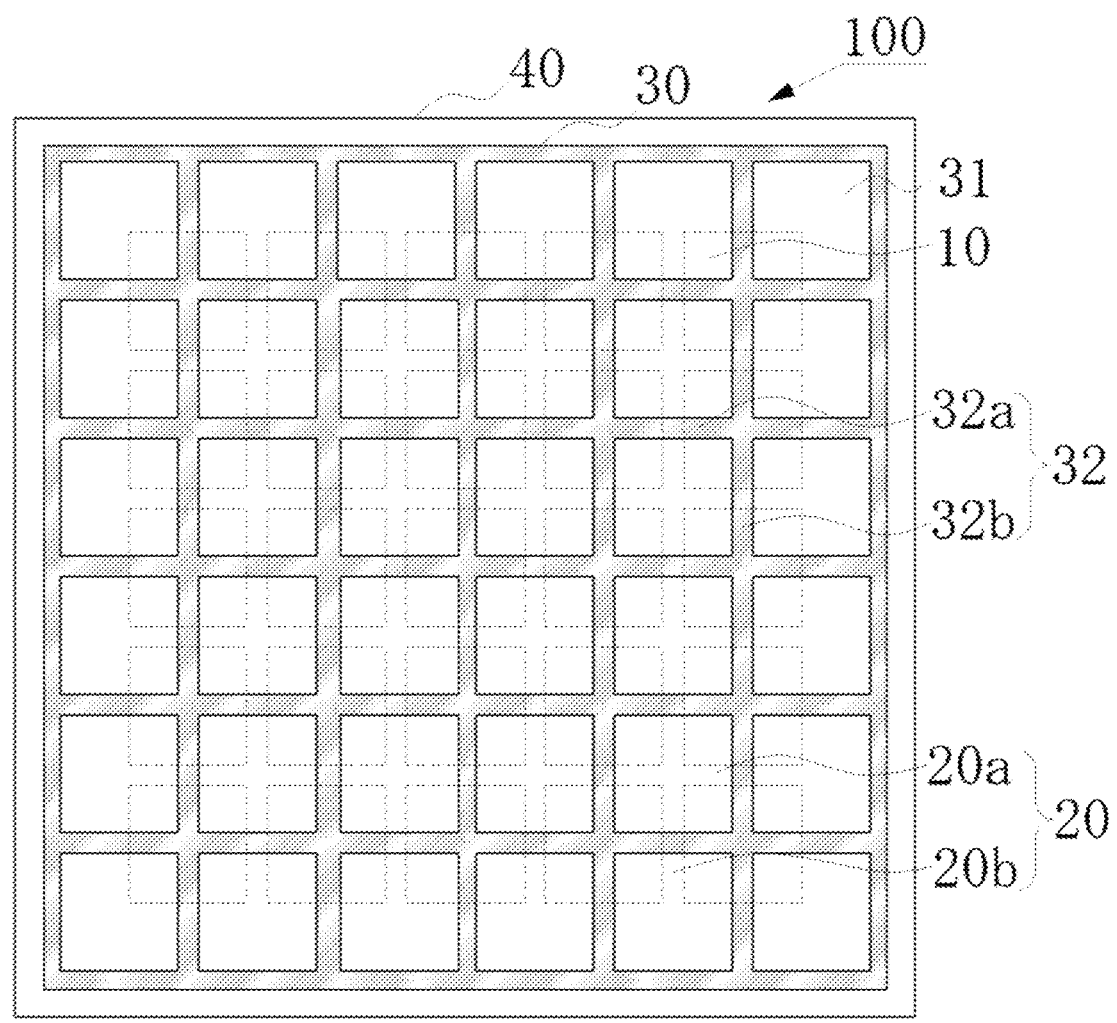
FIG. 1A is a schematic plan view of a light emitting device according to a first embodiment.

Certain embodiments of the present invention will be described below with reference to the drawings. The embodiments are intended as illustrative of configurations to give a concrete form to technical ideas of the present invention, and the scope of the invention is not limited to those described below. In the description below, the same designations or the same reference numerals denote the same or like members and duplicative descriptions will be appropriately omitted.

First Embodiment

Figure 1B:
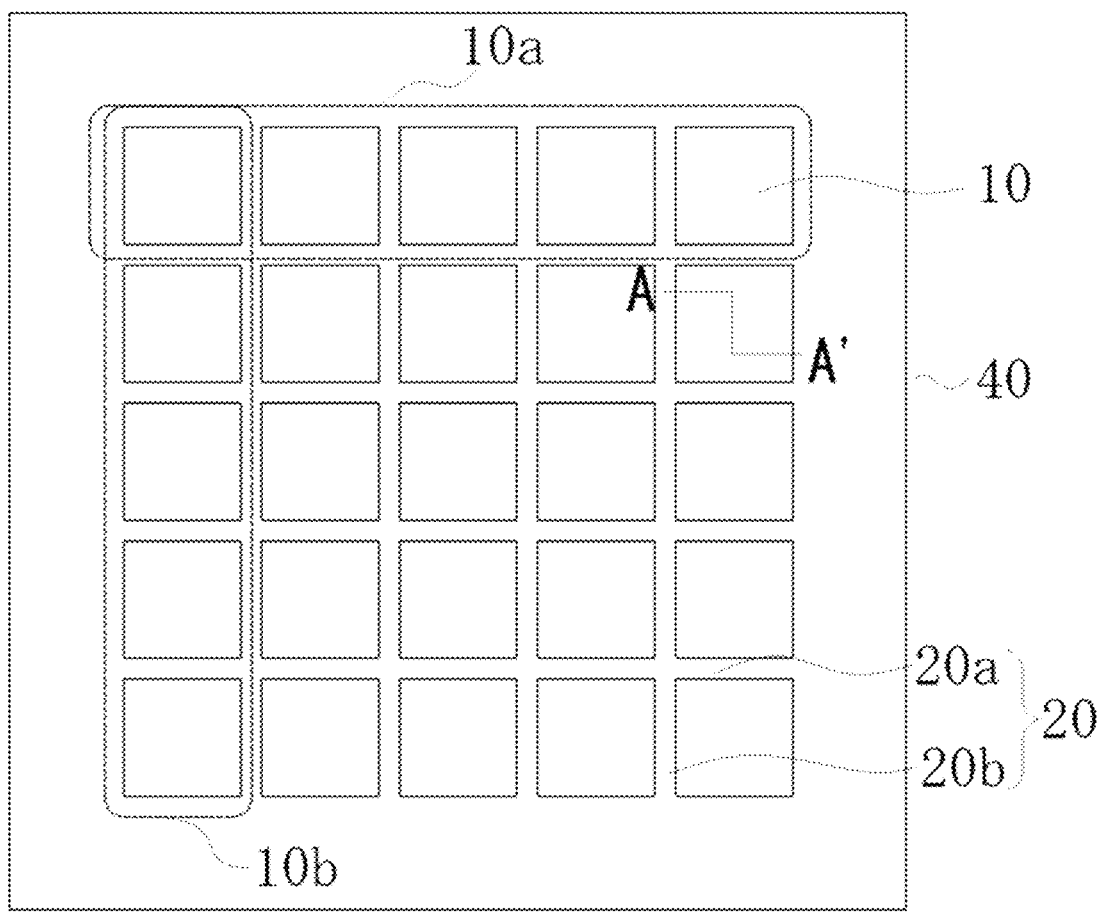
FIG. 1B is a schematic plan view illustrating a light emitting device according to the first embodiment.
Figure 1C:
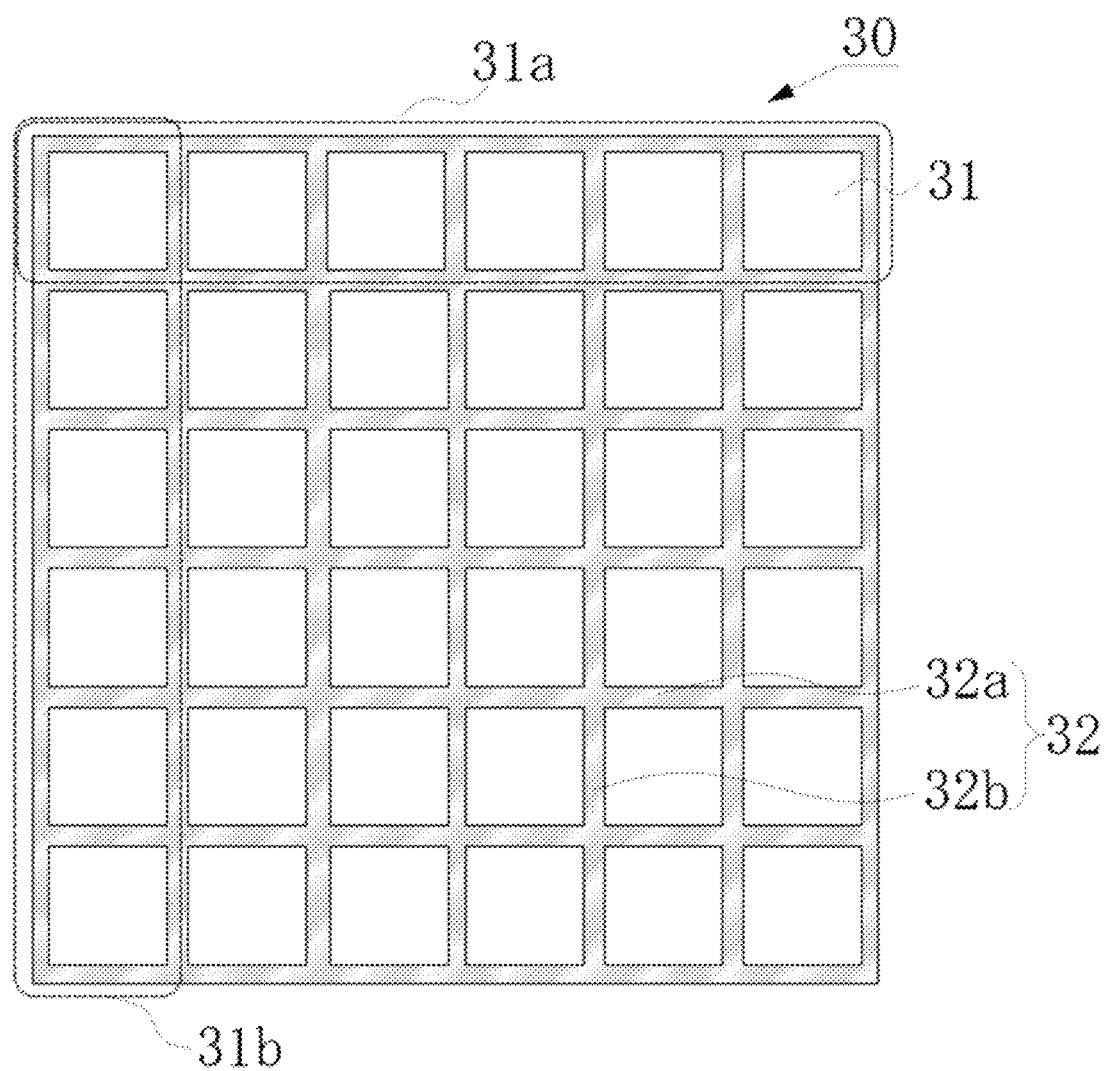
FIG. 1C is a schematic plan view illustrating a light emitting device according to the first embodiment.
Figure 1D:
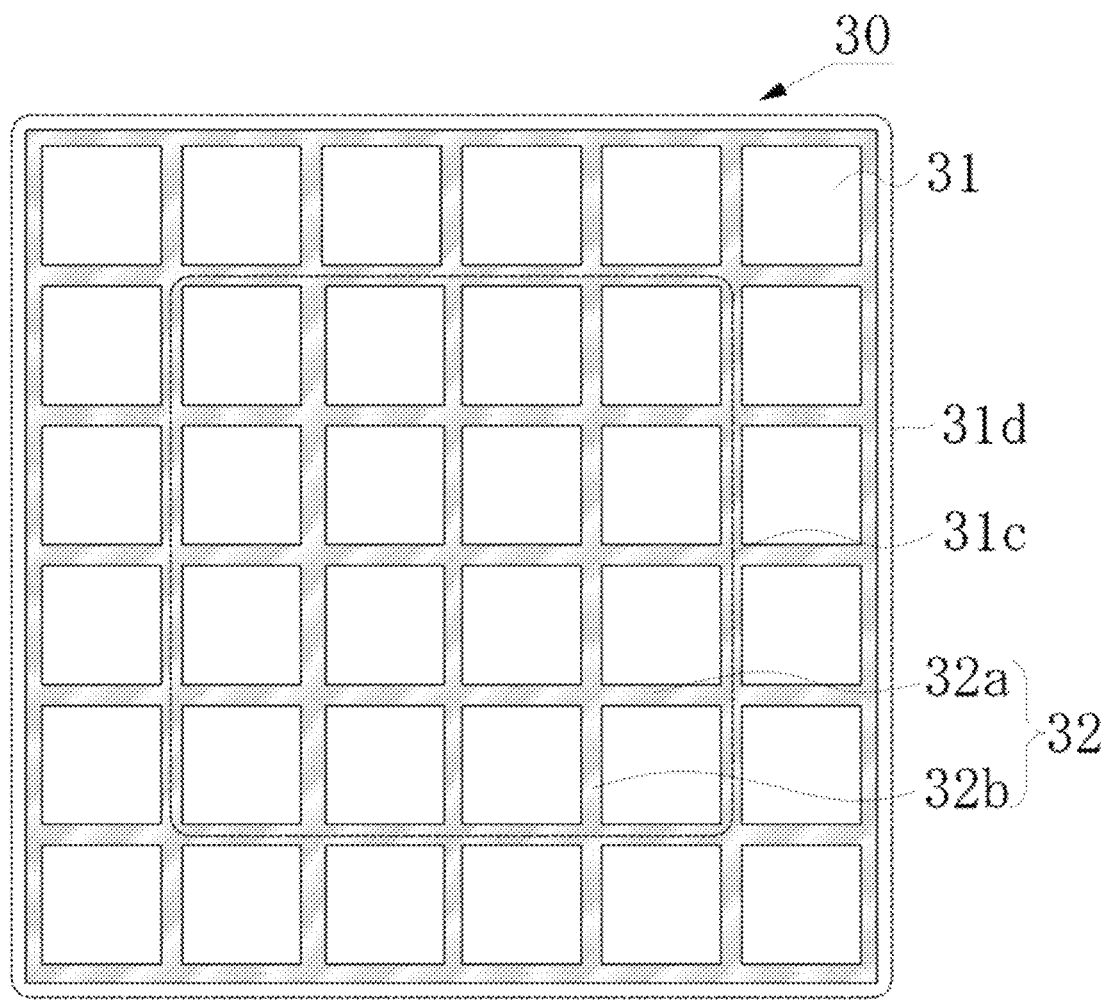
FIG. 1D is a schematic plan view illustrating a light emitting device according to the first embodiment.

In a light emitting device 100 according to a first embodiment, as shown in FIG. 1A, a plurality of LEDs 10 are arranged in rows and columns above a substrate 40, and a wavelength converting member 30 is arranged above the plurality of LEDs 10. The wavelength converting member 30 includes a plurality of fluorescent portions 31 arranged in rows and columns and a lattice-shaped light-shielding portion 32 arranged between the plurality of fluorescent portions 31. FIG. 1B shows the plurality of LEDs 10 arranged in rows and columns above the substrate 40. FIGS. 1C and 1D show the wavelength converting member 30 before being arranged above the plurality of LEDs 10.

In the description below, as shown in FIG. 1B, of the plurality of LEDs 10, a plurality of LEDs 10 arranged in each of the rows may be referred to as "a row of LEDs 10a", and a plurality of LEDs 10 arranged in each of the columns may be referred to as "a column of LEDs 10b", for ease of explanation. Further, a region between two adjacent rows of LEDs 10a may be referred to as a "row-direction spacing region 20a", and a region between two adjacent columns of LEDs 10b may be referred to as a "column-direction spacing region 20b". Also, as shown in FIG. 1C, of the plurality of fluorescent portions 31, a plurality of fluorescent portions 31 arranged in each of the rows may be referred to as "a row of fluorescent portion 31a", and a plurality of fluorescent portions 31 arranged in each of the columns may be referred to as "a column of fluorescent portion 31b". Further, of the lattice-shaped light-shielding portion, each of regions extending in a row direction may be referred to as "a row-direction light-shielding region 32a", and each of regions extending in a column direction may be referred to as "a column-direction light-shielding region 32b". Also, as shown in FIG. 1D, in a top view, the fluorescent portions 31 arranged at an outermost peripheral part of the wavelength converting member 30 may be collectively referred to as an "outer-side fluorescent portion 31d", and the fluorescent portions 31 arranged inward of the outer-side fluorescent portions 31d may be collectively referred to as an "inner-side fluorescent portion 31c". Further, the rows of LEDs 10a and the columns of LEDs 10b may be collectively referred to as "LEDs 10a and 10b". The rows of fluorescent portions 31a and the columns of fluorescent portions 31b may be collectively referred to as "fluorescent portions 31a and 31b". The row-direction light shielding regions 32a and the column-direction light-shielding regions 32b may be collectively referred to as a "light-shielding portion 32". The row-direction spacing regions 20a and the column-direction spacing regions 20b may be collectively referred to as "spacing regions 20".

In the light emitting device 100, as shown in FIGS. 1A, 1C, and 1D, in a top view, each of the row-direction light shielding regions 32a has a width in the column direction smaller than a width of each of the fluorescent portions 31 in the column direction, and each of the column-direction light shielding regions 32b has a width in the row direction smaller than a width of each of the fluorescent portions 31 in the row direction. In other words, the plurality of fluorescent portions 31 is densely arranged. In a similar manner, in a top view, each of the row-direction spacing regions 20a has a width in the column direction smaller than a width of each of the LEDs 10 in the column direction, and each of the column-direction spacing regions 20b has a width in the row direction smaller than a width of each of the LEDs 10 in the row direction. In other words, the plurality of the LEDs 10 are densely arranged. It is noted that, in the present specification, the expression "in a top view" refers to a view from above an object, which is a light-extraction side of the light emitting device, which may also be expressed as "when viewed from above the plurality of LEDs arranged in rows and columns", and refers to not only a view as can be directly seen but also a view as if seen through the component(s) on or above the object, when needed.

In the light emitting device 100, as shown in FIG. 1A, each of the row-direction light shielding regions 32a is located directly above each row of the row-direction LEDs 10a. That is, in a top view, each of the row-direction light shielding regions 32a has a width in the column direction smaller than a width of a corresponding one of the rows of LEDs 10a in the column direction that is located directly below the shielding region, so that each of the row-direction light shielding regions 32a is located within the outline of the corresponding one of the rows of LEDs 10a. In a similar manner, each of the column-direction light shielding regions 32b is located directly above a corresponding one of the columns of LEDs 10b. That is, in a top view, each of the column-direction light shielding regions 32b has a width in the row direction smaller than a width of a corresponding one of the columns of LEDs 10b in the row direction that is located directly below the shielding region 32b, so that each of the column-direction light shielding regions 32b is located within the outline of the corresponding one of the columns of LEDs 10b.

Further, in the light emitting device 100, each of the row-direction spacing regions 20a is located directly below corresponding one of the rows of fluorescent portions 31a. That is, in a top view, each of the row-direction spacing regions 20a has a width in the column direction smaller than a width of a corresponding one of the rows of fluorescent portions 31a in the column direction that is arranged directly above the spacing region 20a, so that each of the row-direction spacing regions 20a is located within the outline of the corresponding one of the rows of fluorescent portions 31a. In a similar manner, each of the column-direction spacing regions 20b is located directly below a corresponding one of the columns of fluorescent portions 31b. That is, in a top view, each of the column-direction spacing regions 20b has a width in the row direction smaller than a width of a corresponding one of the columns of fluorescent portions 31b in the row direction that is arranged directly above the spacing region 20b, so that each of the column-direction spacing regions 20b is located within the outline of the corresponding one of the columns of fluorescent portions 31b.

Further, in the light emitting device 100, the wavelength converting member 30 is disposed so that each of the fluorescent portions 31 of the inner fluorescent portion 31c is overlapped with a portion of each of four of the LEDs 10. Further, the fluorescent portions 31 at four corners of the outer-side fluorescent portion 31d are overlapped with a portion of respective one of the LEDs 10, and each of the fluorescent portions 31 of the outer-side fluorescent portion 31d other than those at the four corners is overlapped with a portion of each of two of the LEDs 10.

In the case where each of LEDs are arranged corresponding to respective one of fluorescent portions as in conventional light emitting devices, and the LEDs and fluorescent portions are respectively densely arranged, each of the fluorescent portions is expected to be arranged directly above respective one of the LEDs. However, due to mounting error of a wavelength converting member and/or irregularity in size of the fluorescent portions, portions of two or more fluorescent portions may be located directly above a single LED in some region. In such a case, a region where each of LEDs are arranged corresponding to respective one of fluorescent portions and a region lacking such a one-to-one correspondence are both present, which may lead to difficulty in controlling the lighting appearance in response to turning-on and turning-off pattern of the light emitting device. In view of the above, in the light emitting device 100, each of the LEDs 10 are not designed to a correspond to respective one of the fluorescent portions 31, but instead, a portion of each of four fluorescent portions 31 are provided corresponding to each of the LED 10, while densely arranging plurality of LEDs 10 and densely arranging a plurality of fluorescent portions 31. That is, the light shielding portion 32 is designed to overlap the LEDs 10, and the fluorescent portions 31 are designed to overlap the spacing regions 20, so that the number of the fluorescent portions 31 located directly above each of the LEDs 10 is not easily varied over an entirety of the light emitting device 100 even if a mounting error of the wavelength converting member 30 occurs or the size of the fluorescent portions 31 is varied. Accordingly, the light emitting device 100 can have a high brightness and lighting appearance in response to turning-on and turning-off pattern of the light emitting device 100 can be controlled as designed.

In the light emitting device 100, in a top view, each of intersections between the row-direction spacing regions 20a and the column-direction spacing regions 20b is spaced inward from an outer periphery of a corresponding one of the fluorescent portions 31 so that a uniform number of the fluorescent portions 31 are located directly above each of the LEDs 10. Accordingly, even if a certain amount of shift in a positional relationship between the LEDs 10 and the fluorescent portions 31 occurs at the time of mounting the wavelength converting member 30, a substantially constant light emitting area of the fluorescent portions 31 can be maintained when a corresponding one of the LEDs 10 is turned on. That is, even if a certain amount of shift in a positional relationship between the LEDs 10 and the fluorescent portions 31 occurs at the time of mounting the wavelength converting member 30, it merely lead a change in the location of the light shielding portion 32 directly above the corresponding LEDs, and a total of light-emitting areas of the portions of the four fluorescent portions 31 can be maintained substantially unchanged.

Each component of the light emitting device 100 is described in detail below.

Substrate

The substrate 40 is configured to support the plurality of LEDs 10. When the wirings for supplying current to the LEDs 10 are provided separately from the substrate 40, the wirings may not be disposed on the substrate 40. Otherwise, the wirings may be disposed on the substrate 40.

For the substrate 40, a substrate made of silicon, sapphire, aluminum nitride, or aluminum oxide, or a printed circuit board, or the like may be used.

Plurality of LEDs

In the present specification, "a plurality of LED 10s" may include either a discrete LED or an LED that can function as an LED. More specifically, a plurality of discrete LED elements may be employed as the "plurality of LEDs 10", or, for example, a plurality of LED portions, each can be a light emitting portion, and provided on a single growth substrate can be employed as the "plurality of LEDs 10".

Figure 2:
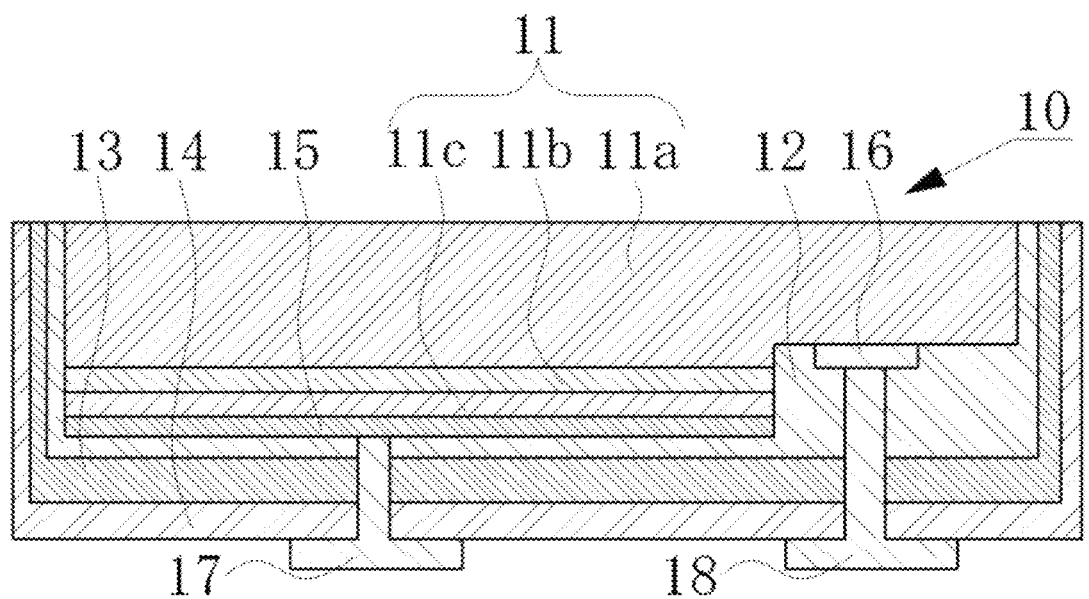
FIG. 2 is a schematic cross-sectional view of an LED shown in FIG. 1B taken along the line A-A'.

The plurality of LEDs 10 may have a semiconductor structure 11 as shown in FIG. 2. The semiconductor structure 11 includes, for example, an n-side layer 11a, a light emitting layer 11b, and a p-side layer 11c in this order. For each layer of the semiconductor structure 11, for example, a nitride semiconductor such as $In_XAl_YGa_{1-X-Y}N$ ($0 \leq X$, $0 \leq Y$, $X+Y \leq 1$) can be used. The LEDs 10 may or may not include a growth substrate for growing the semiconductor structure 11. In the light emitting device 100, the LEDs 10 are mounted on the substrate 40 in a face-down manner, and a growth substrate has been removed. For the growth substrate, for example, sapphire or gallium nitride may be used. In the case where the LEDs 10 are mounted in a face-down manner, a dielectric layer 12, a light shielding layer 13, and a protective layer 14 can be further disposed in order from a semiconductor structure 11 side so as to substantially cover the entire lateral sides and a lower side of the semiconductor structure. With the dielectric layer 12 and the light shielding layer 13, light emitted from the light emitting layer 11b is reflected at the dielectric layer 12 and at the light shielding layer 13 and emitted upward from a light extracting surface side of each of the LEDs 10, so that light extraction efficiency of the light emitting device 100 can be improved. For the dielectric layer 12, $SiO_2$, $Nb_2O_5$, $TiO_2$, $Al_2O_3$, or the like can be used. For the light shielding layer 13, a metal such as Ti, Al, Ag, or the like can be used. With the protective layer 14, the LEDs 10 can be protected from the outside.

Further, each of the LEDs 10 may include a p-contact layer 15 and a p-pad electrode 17 that are electrically connected to the p-side layer 11c, and an n-contact layer 16 and an n-pad electrode 18 that are electrically connected to the n-side layer 11a. With this arrangement, electric power can be supplied to the LEDs 10 from an external component.

Figure 3:
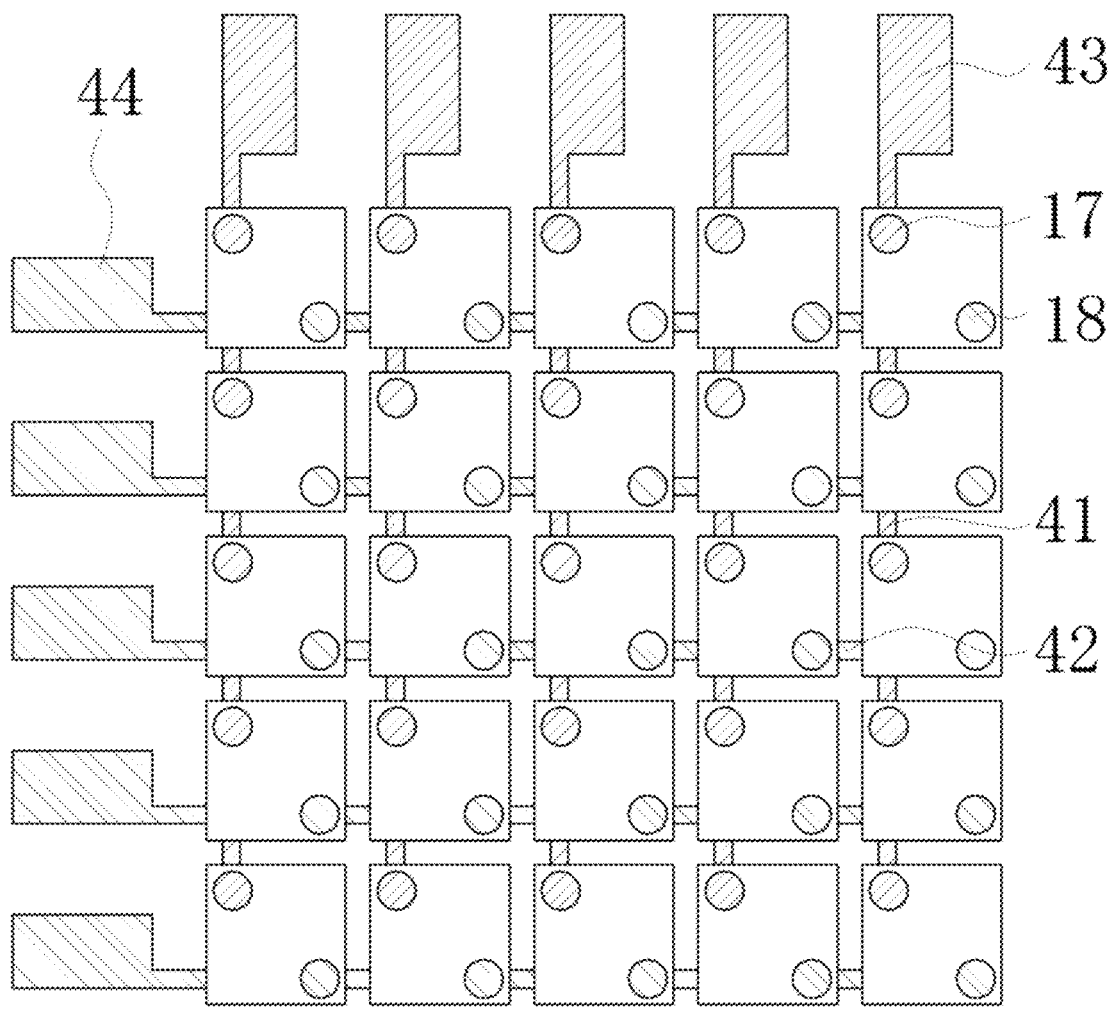
FIG. 3 is a schematic plan view of a wiring structure of a light emitting device according to the first embodiment.
Figure 4:
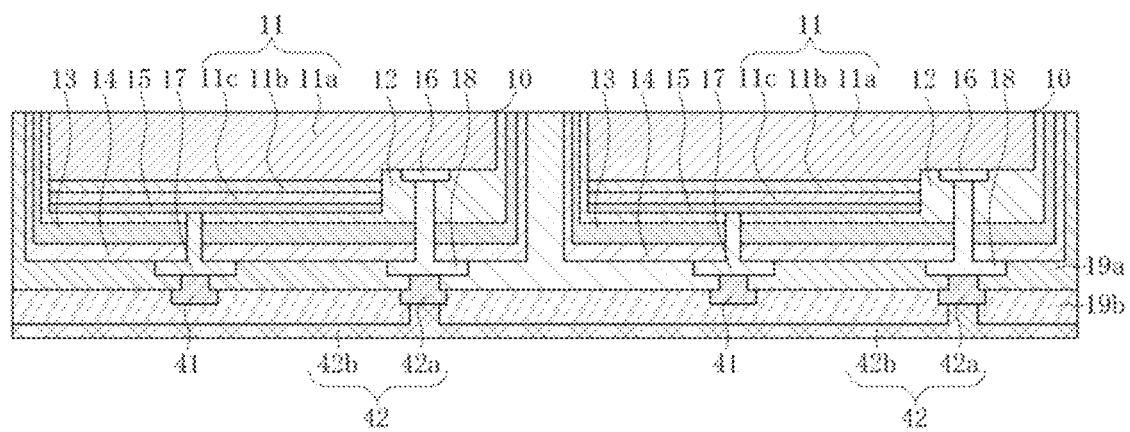
FIG. 4 is a schematic cross-sectional view showing a wiring structure of a light emitting device according to the first embodiment.

It is preferable that each of the plurality of LEDs 10 can be individually operated. With this configuration, the plurality of LEDs 10 can be turned on or turned off in any appropriate pattern. For a method of individually controlling turn-on of the plurality of LEDs 10, a passive matrix configuration or an active matrix configuration may be employed. In the light emitting device 100, as shown in FIG. 3 and FIG. 4, a wiring structure is provided so that turn-on of the plurality of LEDs 10 can be individually controlled using a passive matrix configuration. That is, a plurality of p-side wirings 41 is disposed to respectively extend in the column direction, and the p-pad electrodes 17 of each column of the LEDs 10 are electrically connected to a corresponding one of the p-side wirings 41. Also, a p-side connecting terminal 43 is arranged at one end of each of the p-side wirings 41 corresponding to each column of the LEDs 10. Further, a plurality of n-side wirings 42 is disposed to respectively extend in the row direction, and the n-pad electrodes 18 of each row of the LEDs 10 are electrically connected to a corresponding one of the n-side wirings 42. As shown FIG. 4, each of the n-side wirings 42 can include an n-side first wiring 42a and an n-side second wiring 42b. Also, an n-side connecting terminal 44 is arranged at one end of each of the n-side wiring 42 corresponding to each row of the LEDs 10. With this arrangement, for example, electric power can be supplied to each row of the LEDs 10 in a time-sharing manner, so that turn-on of the LEDs 10 can be individually controlled. It is noted that, in FIG. 3, schematic illustration of only the LEDs 10 and the wiring structure is given for ease of explanation of relationship between the LEDs 10 and the wiring structure.

Individual control of the LEDs 10 allows the light emitting device 100 to be used, for example, an adaptive driving beam (ADB) headlamp for automobiles. In the case of using the light emitting device 100 for an ADB headlamp, the light emitting device 100 may be used so that the LEDs corresponding to one or more areas not intended to irradiate light are turned off while turning on the other LEDs 10. Accordingly, a driver of an oncoming vehicle or a pedestrian can be selectively prevented from being irradiated with the light while allowing irradiating light to other areas.

The plurality of LEDs 10 are arranged in rows and columns. With this arrangement, compared with the case where the LEDs 10 are arranged in a random manner, turning-on and turning-off of a plurality of LEDs 10 can be facilitated so that appropriate pattern of lighting can be easily formed. When the light emitting device 100 is used for an ADB headlight, typically, a total width of the LEDs 10a and 10b in a direction of the substrate corresponding to a left-right direction or in parallel with a road surface determines a width of a region to be irradiated with the ADB headlight, and a total width of the LEDs 10a and 10b in a direction of the substrate corresponding to an up-and down direction determines a width of a region to be irradiated with the ADB headlight in an up-down direction.

Wavelength Converting Member

The wavelength converting member 30 includes a plurality of fluorescent portions 31 each containing a fluorescent material. The fluorescent material is adapted to emit fluorescence upon being excited by light emitted from the LEDs 10. Examples of the fluorescent material that can be excited by a blue light or an ultraviolet light include a yttrium aluminum garnet-based fluorescent material activated with cerium, a lutetium aluminum garnet-based activated with cerium, a nitrogen-containing calcium aluminosilicate fluorescent material activated with europium and/or chromium, a silicate-based fluorescent material activated with europium, a β-sialon-based fluorescent material, nitride-based fluorescent materials such as a CASN-based fluorescent material and a SCASN-based fluorescent material, KSF-based fluorescent material, and a sulfide-based fluorescent material. Alternatively, a quantum dot fluorescent material may be used for the fluorescent material. Combination of one or more of such fluorescent materials and a blue LED or an ultraviolet LED allows for emitting a various color light such as a white light.

Each of the fluorescent portions 31 may contain a light-transmissive material. Examples of the light-transmissive material include a ceramic material such as aluminum nitride, aluminum oxide, yttrium oxide, and yttrium-aluminum-perovskite (YAP), glass, and a resin such as a silicone resin and an epoxy resin. For the light-transmissive material, a ceramic material of good light resistance and good heat resistance is preferably used.

The wavelength converting member 30 includes a lattice-shaped light-shielding portion 32 arranged between the plurality of fluorescent portions 31. With this arrangement, one or more of the fluorescent portions 31 located directly above each of the LEDs that is turned-on can be mainly caused to emit light. That is, at least a portion of light from each of the LEDs 10 that is turned-on is shielded by the light shielding portion 32, so that light is not easily incident on the fluorescent portions 31 that are not located directly above the LED 10. Accordingly, contrast of the light emitting device 100 can be improved.

The light shielding portion 32 can be made of a material that can shield 60% or more, preferably 80% or more of light from the LEDs 10. For the light-shielding portion 32, a metal film made of a single layer or a plurality of layers and/or a multilayer film in which two or more dielectric materials are layered (i.e., dielectric multilayer film) can be used. The light-shielding portion 32 preferably includes a dielectric multilayer film. A dielectric multilayer film absorbs less light compared to a metal, and thus can efficiently reflect light. When both a metal film and a dielectric multilayer film are used for the light-shielding portion 32, the dielectric multilayer film and the metal film are preferably arranged in order from a fluorescent portions 31 side. With this arrangement, light that is not reflected by the dielectric multilayer film can be reflected by the metal film, so that light extraction efficiency from the fluorescent portions 31 can be further improved.

Relationship Between Plurality of LEDs and Wavelength Converting Member

Each of the row-direction light shielding regions 32a is preferably designed to extend directly above the centers of a plurality of LEDs 10 located directly below the row-direction light shielding region 32a. In a similar manner, each of the column-direction light shielding regions 32b are preferably designed to extend directly above centers of a plurality of LEDs 10 located directly below the column-direction light shielding region 32b. This arrangement allows for a great increase in an area where each of the LEDs 10 and a corresponding one of the fluorescent portions 31 overlap at the time of designing, so that it is relatively easy to arrange a portion of each of four fluorescent portions 31 directly above each of the LEDs 10 at the time of mounting.

Further, each of the row-direction spacing regions 20a is preferably designed to extend directly under the centers of a plurality of fluorescent portions 31 located directly above the row-direction spacing region 20a. In a similar manner, each of the column-direction spacing regions 20b are preferably designed to extend directly under the center of each of a plurality of fluorescent portions 31 located directly above the column-direction spacing region 20b. This arrangement allows for a great increase in an area where each of the LEDs 10 and a corresponding one of the fluorescent portions 31 overlap at the time of designing, which in turn allows for arranging of a portions of each of four LEDs 10 directly below each of the fluorescent portions 31 of the inner-side fluorescent portion 31c, after mounting.

The respective LEDs 10 and fluorescent portions 31 preferably have a substantially rectangular peripheral shape in a top view. Such a shape allows for facilitating dense arrangement of the plurality of LEDs 10, so that light emission intensity of the light emitting device 100 can be improved. Further, dense arrangement of the plurality of fluorescent portions 31 can also be facilitated, so that light can be emitted more uniformly at the light extracting side.

In the light emitting device 100, the respective LEDs 10 and fluorescent portions 31 have substantially the same size. Accordingly, in the configuration where both the LEDs 10 and the fluorescent portions 31 are densely arranged, arrangement of a portion of each of four fluorescent portions 31 directly above each of the LEDs 10 can be facilitated, while increasing an area where the LEDs 10 and the fluorescent portions 31 are overlapped.

Each of the LEDs 10 preferably has a width in the column direction in a range of 3 times to 150 times, more preferably 30 times to 100 times a width of each of the row-direction light shielding regions 32a in the column direction. Similarly, each of the LEDs 10 preferably has a width in the row direction in a range of 3 times to 150 times, more preferably in a range of 30 times to 100 times a width of each of the column-direction light shielding region 32b in the row direction. With a ratio between a width of each of the LEDs 10 and a width of a corresponding portion of the light-shielding portion 32 above a certain value, an overlapping area of each of the LEDs 10 and respective one of the fluorescent portions 31 can be sufficiently secured, which allows for higher luminance and reducing variance in number of the fluorescent portions 31 located directly above each of the LEDs 10. Further, with the ratio between a width of each of the LEDs 10 and a width of a corresponding portion of the light-shielding portion 32 below a certain value, a width of the light-shielding portion 32 can be increased to some extent, so that a display with high contrast can be obtained.

Each of the LEDs 10 can have a width in the column direction in a range of 30 µm to 300 µm, preferably in a range of 30 µm to 200 µm. In a similar manner, each of the LEDs 10 can have a width in the row direction in a range of 30 µm to 300 µm, preferably in a range of 30 µm to 200 µm.

A distance between two of the plurality of fluorescent portions 31 adjacent to each other in the row direction is 50 µm or less, and a distance between two of the plurality of fluorescent portions 31 adjacent to each other in the column direction is 50 µm or less. More specifically, each of the row-direction light shielding regions 32a can have a width in the column direction in a range of 1 µm to 20 µm, preferably in a range of 2 µm to 15 µm. In a similar manner, each of the column-direction light shielding regions 32b can have a width in the row direction in a range of 1 µm to 20 µm, preferably in a range of 2 µm to 15 µm.

Each of the fluorescent portions 31 preferably has a width in the column direction in a range of 3 times to 150 times, more preferably in a range of 10 times to 100 times a width of each of the row-direction spacing regions 20a in the column direction. In a similar manner, each of the fluorescent portions 31 preferably has a width in the row direction in a range of 3 times to 150 times, more preferably in a range of 10 times to 100 times a width of each of the column-direction spacing regions 20b in the row direction. With a ratio between a width of each of the fluorescent portions 31 and a width of a corresponding one of the spacing regions 20 above a certain value, an overlapping area of each of the fluorescent portions 31 and respective one of the LEDs 10 can be sufficiently secured, which allows for higher luminance and reducing variance in number of the fluorescent portions 31 located directly above each of the LEDs 10. Further, with a ratio between a width of each of the fluorescent portions 31 and a width of a corresponding one of the spacing regions 20 below a certain value, a width of each of the spacing regions 20 can be increased at a certain amount, so that a display with high contrast can be achieved.

Each of the fluorescent portions 31 can have a width in the column direction in a range of 30 µm to 300 µm, preferably in a range of 30 µm to 200 µm. Similarly, each of the fluorescent portions 31 can have a width in the row direction in a range of 30 µm to 300 µm, preferably in a range of 30 µm to 200 µm.

A distance between two of the plurality of LEDs 10 adjacent to each other in the row direction can be 50 µm or less, and a distance between two of the plurality of LEDs adjacent to each other in the column direction can be 50 µm or less. More specifically, each of the row-direction spacing regions 20a can have a width in the column direction in a range of 1 µm to 20 µm, preferably in a range of 2 µm to 15 µm. Similarly, each of the column-direction spacing regions 20b can have a width in the row direction in a range of 1 µm to 20 µm, preferably in a range of 2 µm to 15 µm.

Second Embodiment

Figure 5:
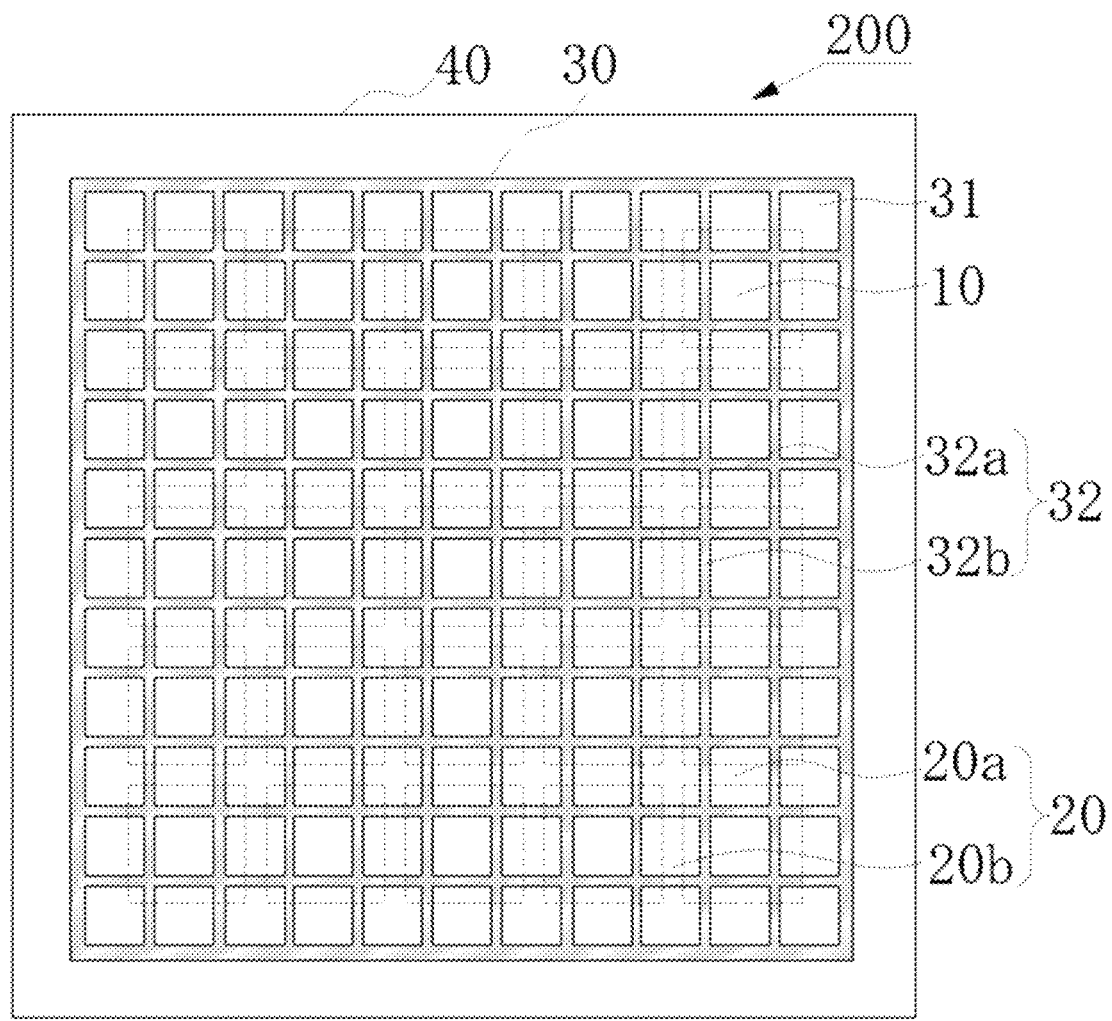
FIG. 5 is a schematic plan view of a light emitting device according to a second embodiment.

FIG. 5 shows a light emitting device 200 according to a second embodiment. The light emitting device 200 is different from the light emitting device 100 according to the first embodiment in that each of fluorescent portions 31 has a size smaller than each of LEDs 10 in the row direction and the column direction, two adjacent row-direction light shielding regions 32a are located directly above a corresponding one of rows of LEDs 10a, and two adjacent column-direction light shielding regions 32b are located directly above a corresponding one of columns of LEDs 10b. Other configurations are similar to those in the light emitting device 100 according to the first embodiment.

In the light emitting device 200, as shown in FIG. 5, two adjacent row-direction light-shielding regions 32a are located directly above a corresponding one of the rows of the LEDs 10a, and two adjacent column-direction light-shielding regions 32b are located directly above a corresponding one of the columns of the LEDs 10b. That is, in a top view, each of the LEDs 10 has a size greater than each of the fluorescent portions 31, each row of the LEDs 10a is arranged to at least partially overlap three adjacent rows of the fluorescent portions 31a directly above the row of the LEDs 10a, and each column of the LEDs 10b is arranged to at least partially overlap three adjacent columns of the fluorescent portions 31b directly above the column of the LEDs 10b. In other words, in a region directly above each of the LEDs 10, fluorescent portions 31 are arranged such that one fluorescent portion 31 is located at the center of the region and a portion of each of eight fluorescent portions 31 are arranged surrounding the fluorescent portion 31 at the center of the region.

Although there may be certain limitations on the dimensions and to the arrangement density of the LEDs 10, associating with the manufacturing or the like, in order to achieve highly precise control of lighting appearance in response to turning-on and turning-off pattern of the light emitting device, the LEDs 10 that are used as the light emission source of the light emitting device are needed to be miniaturized and densely arranged. Accordingly, in the first embodiment and the second embodiment, the plurality of LEDs 10 are assumed to have substantially the same and sufficiently small size and are assumed to be arranged at substantially the same and high density In this case, in a top view, an overlapping area of each of the LEDs 10 and a respective one of the fluorescent portions 31 located directly above each of the four corners of the respective LEDs 10 is smaller in the second embodiment than that in the first embodiment. Thus, at the time of mounting the fluorescent portion 30, the number of fluorescent portions 31 located directly above each of the LEDs 10 may change more easily in the second embodiment than in the first embodiment. On the other hand, in the second embodiment, each of the fluorescent portions 31 has a smaller size than each of the LEDs 10, allowing more precise lighting appearance in response to turning-on and turning-off pattern of the light emitting device compared to that in the first embodiment.

Third Embodiment

Figure 6:
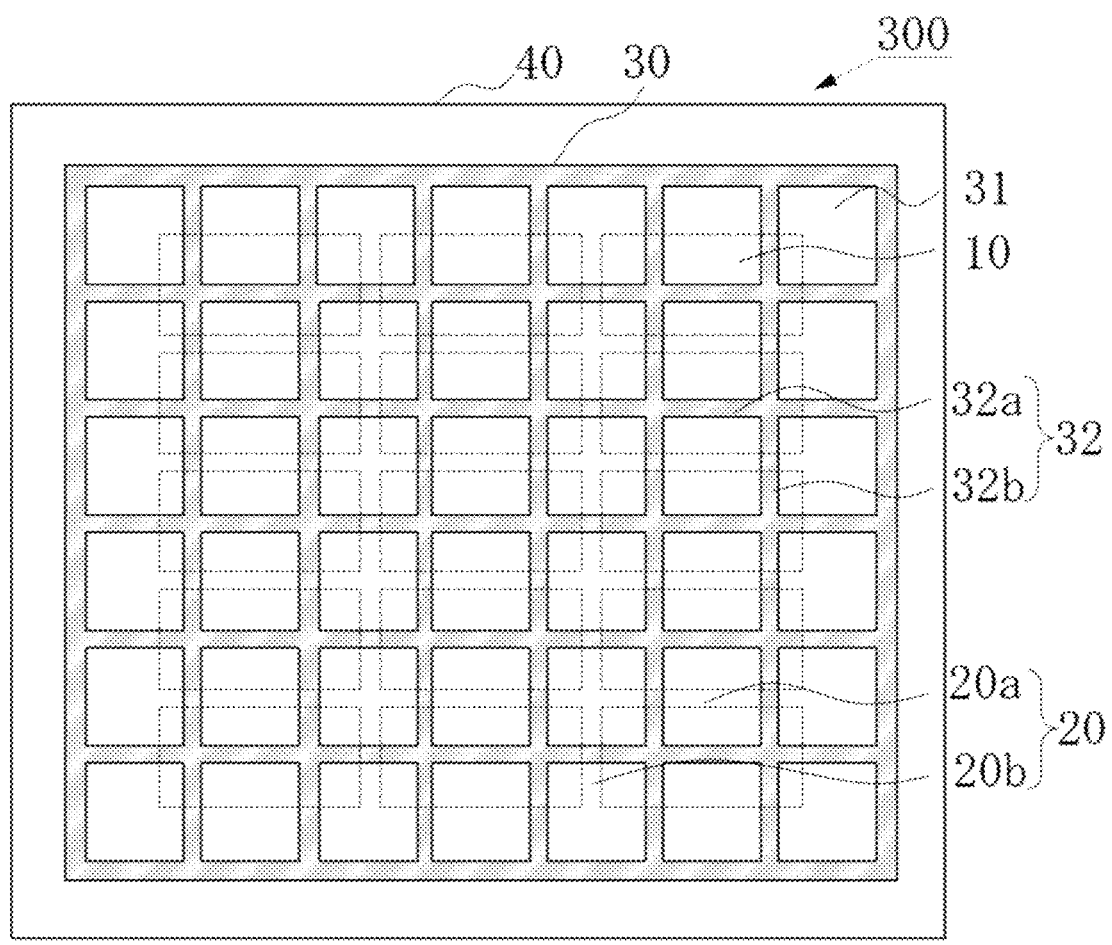
FIG. 6 is a schematic plan view of a light emitting device according to a third embodiment.

FIG. 6 shows a light emitting device 300 according to a third embodiment. The light emitting device 300 is different from the light emitting device 100 according to the first embodiment in that, in a top view, each of fluorescent portions 31 has a size smaller than each of LEDs 10 in the column direction and two adjacent column-direction light shielding regions 32b are located directly above each of columns of LEDs 10b. Other configurations are similar to those in the light emitting device 100 according to the first embodiment. The light emitting device 300 can have an effect similar to that of the light emitting device 200 according to the second embodiment.

Fourth Embodiment

Figure 7:
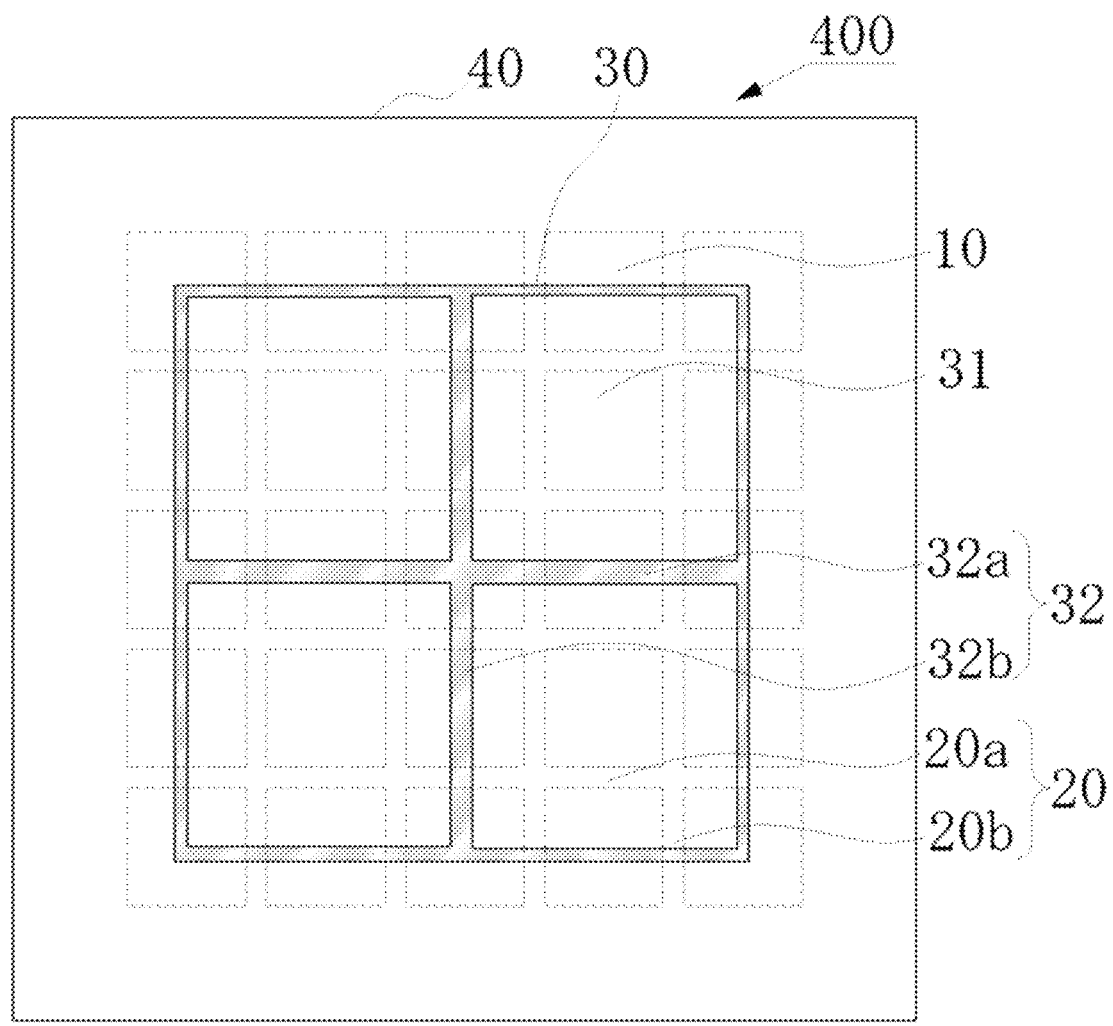
FIG. 7 is a schematic plan view of a light emitting device according to a fourth embodiment.

FIG. 7 shows a light emitting device 400 according to a fourth embodiment. The light emitting device 400 is different from the light emitting device 100 according to the first embodiment in that each of fluorescent portions 31 has a size larger than each of LEDs 10 in the row direction and the column direction, two adjacent row-direction spacing regions 20a are arranged directly below a corresponding one of rows of fluorescent portions 31a, and two adjacent column-direction spacing regions 20b are arranged directly below a corresponding one of columns of fluorescent portions 31b. Other configurations are similar to those in the light emitting device 100 according to the first embodiment.

In the light emitting device 400, as shown in FIG. 7, two adjacent row-direction spacing regions 20a are located directly below a corresponding one of the rows of fluorescent portions 31a, and two adjacent column-direction spacing regions 20b are located directly below a corresponding one of the columns of the fluorescent portions 31b. That is, in a top view, each of the fluorescent portions 31 has a size greater than each of the LEDs 10, and each row of the fluorescent portions 31a is arranged to at least partially overlap three adjacent rows of the LEDs 10a directly below the row of the fluorescent portions 31a, and each column of the fluorescent portions 31b is overlapped with three columns of the LEDs 10b located below the column of the fluorescent portions 31b. In other words, in a region directly below each of the fluorescent portions 31, LEDs 10 are arranged such that one LED 10 is located at the center of the region and a portion of each of eight LEDs 10 are arranged surrounding the LED 10 at the center of the region.

Although there may be certain limitations on the dimensions and to the arrangement density of the LEDs 10, associating with the manufacturing or the like, in order to achieve highly precise control of lighting appearance in response to turning-on and turning-off pattern of the light emitting device, the LEDs 10 that are used as the light emission source of the light emitting device are needed to be miniaturized and densely arranged. Accordingly, in the first embodiment and the fourth embodiment, the plurality of LEDs 10 are assumed to have substantially the same and sufficiently small size and are assumed to be arranged at substantially the same and high density. In this case, in the light emitting device 400, an overlapping area of each of the fluorescent portions 31 and respective one of the LEDs 10 located directly below each of the four corners of the fluorescent portion 31 is similar to that in the first embodiment. Thus, similar to that in the first embodiment, in the fourth embodiment, variance in number of the fluorescent portions 31 located directly above each of the LEDs 10 does not easily occur at the time of mounting the fluorescent portion 30.

Fifth Embodiment

Figure 8:
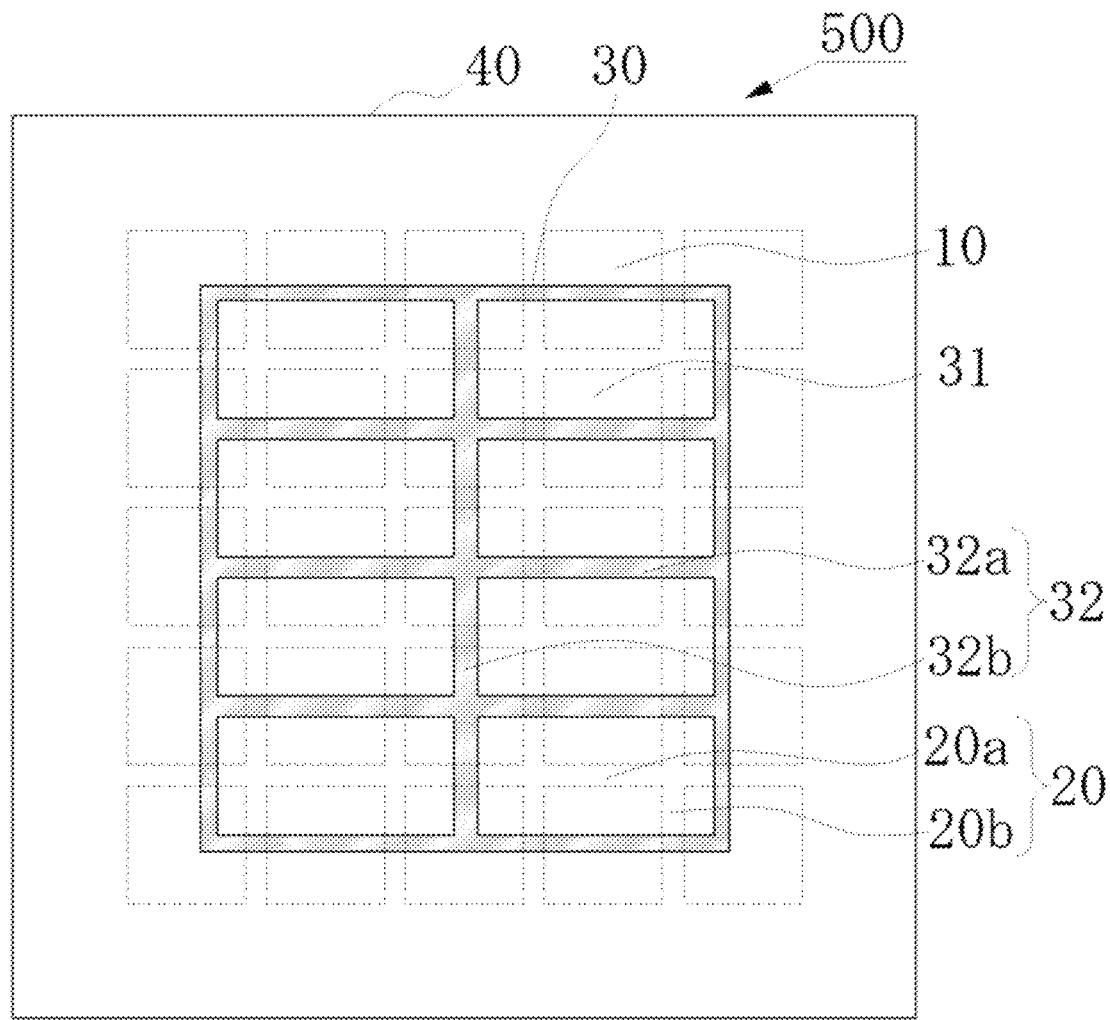
FIG. 8 is a schematic plan view of a light emitting device according to a fifth embodiment.

FIG. 8 shows a light emitting device 500 according to a fifth embodiment. The light emitting device 500 is different from the light emitting device 100 according to the first embodiment in that, in a top view, each of fluorescent portions 31 has a size larger than each of LEDs 10 in the column direction and two adjacent column-direction spacing regions 20b are located directly below each columns of the fluorescent portions 31b. Other configurations are similar to those in the light emitting device 100 according to the first embodiment. The light emitting device 500 can achieve similar performance to that of the light emitting device 400 according to the fourth embodiment.

Example

With reference to FIGS. 1A to 3 and FIGS. 9 to 11, one example according to the first embodiment will be described.

On a growth substrate made of sapphire, a layered body including an n-side layer 11a, a light emitting layer 11b, and a p-side layer 11c, each of which are made of a nitride semiconductor, were disposed in order from a growth substrate side. Then, a p-contact electrode 15 made of ITO was disposed on a surface of the p-side layer 11c. Subsequently, the p-contact electrode 15 and the layered body were etched from a side of the p-side layer 11c to demarcate into a plurality of element regions each having an exposed portion of the n-side layer 11, and configured to obtain a plurality of LEDs 10, a schematic cross-section of each of which is shown in FIG. 2. Subsequently, in each of the plurality of element regions, an n-contact electrode 16 made of Ti/Rh (Ti and then Rh are disposed on a side of the layered body. The same can be applied below.) was formed. Next, a dielectric layer 12, a light shielding layer 13, and a protective layer 14 were formed in order on the layered body over the plurality of element regions. For the dielectric layer 12, a dielectric multilayer film made of three repetitions of a comparatively thick $SiO_2$ layer and an $SiO_2/Nb_2O_5$ layer was formed. For the light shielding layer 13, a Ti film was formed. For the protective layer 14, an $SiO_2$ film was formed. Subsequently, etching was performed to remove portions from the layered structure including the dielectric layer 12, the light shielding layer 13, and the protective layer 14, to expose a portion of the p-contact electrode 15 and a portion of the n-contact electrode 16 in each of the plurality of element regions. Then, p-pad electrodes 17 and n-pad electrodes 18 each made of Ti/Rh/Au were simultaneously disposed on the respective exposed portions of the p-contact electrodes 15 and the exposed portions of the n-contact electrodes 16.

After that, in order to allow the plurality of LEDs 10 to be operated individually in a passive-matrix configuration, p-side wirings 41 were disposed to be respectively electrically connected to p-pad electrodes 17 in each column of the LEDs 10, and n-side wirings 42 were disposed to be respectively electrically connected to n-pad electrodes 18 in each row of the LEDs 10. More details thereof will be described below with reference to FIGS. 3 and 4.

As shown in FIG. 4, a first resin layer 19*a* made of an epoxy-based resin was formed over the plurality of element regions except for a portion of each of the p-pad electrodes 17 and a portion of each of the n-pad electrodes 18. Next, the p-side wirings 41 made of Ti/Rh/Au/Ti were respectively formed on the exposed portion of respective one of the p-pad electrodes 17, and n-side first wirings 42*a* made of Ti/Rh/Au/Ti were respectively formed on the exposed portion of respective one the n-pad electrodes 18. As shown in FIGS. 3 and 4, the p-side wirings 41 were disposed to extend in the column direction on a surface of the first resin layer 19*a* so that each of the p-side wirings 41 electrically connects the p-pad electrodes 17 of the LEDs 10 to each other in each column of the plurality of LEDs 10. Next, as shown in FIG. 4, a second resin layer 19*b* made of an epoxy-based resin was disposed over the plurality of element regions except for a portion of each of the n-side first wirings 42*a*. Next, n-side second wirings 42*b* made of Ti/Rh/Au/Ti were respectively disposed on the exposed portion of each of the n-side first wirings 42*a*. The n-side second wirings 42*b* were formed to extend in the row direction on a surface of the second resin layer 19*b* so that each of the n-side second wirings 42*b* electrically connects the n-side first wirings 42*a* of the LEDs 10 to each other in each row of the plurality of LEDs 10. Accordingly, the p-side wirings 41 and the n-side second wirings 42*b* are stereoscopically intersect with each other via the second resin layer.

Then, using an epoxy-based resin, the electrode surface sides of the plurality of LEDs 10, that is, respective sides of the plurality of LEDs 10 with the p-pad electrodes 17 and the n-pad electrodes 18, were bonded to a substrate 40 made of sapphire and being configured to support the plurality of LEDs 10. Subsequently, the growth substrate was removed by using a laser lift-off (LLO) technique, and chemical mechanical polishing (CMP) was performed to expose the light-extracting surfaces of the plurality of LEDs 10 and obtain a structure of each of the LEDs 10 as shown in FIG. 2. Accordingly, a structure in which the plurality of LEDs 10 and the wirings 41 and 42 are supported by the substrate 40 was obtained. Next, the exposed light extracting surface of each of the plurality of LEDs 10 was roughened by etching. With this, light emitted from each of the plurality of LEDs 10 can be scattered at the roughened light extracting surface, which can improve light extracting efficiency. Further, from the light extracting surface side of the plurality of LEDs 10, a region between the plurality of LEDs 10, which has a lattice shape in a top view, was partially removed in a depth direction by etching. A region between two adjacent LEDs in the row direction serve as a row-direction spacing region 20*a*, and a region between two adjacent LEDs in the column direction serves as a column-direction spacing region 20*b*.

Figure 9A:
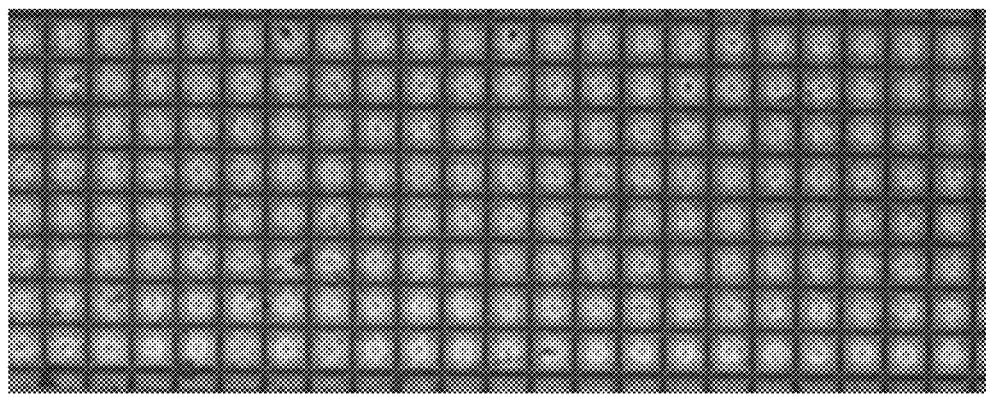
FIG. 9A is an image showing a plurality of LEDs in the light emitting device according to one example.
Figure 9B:
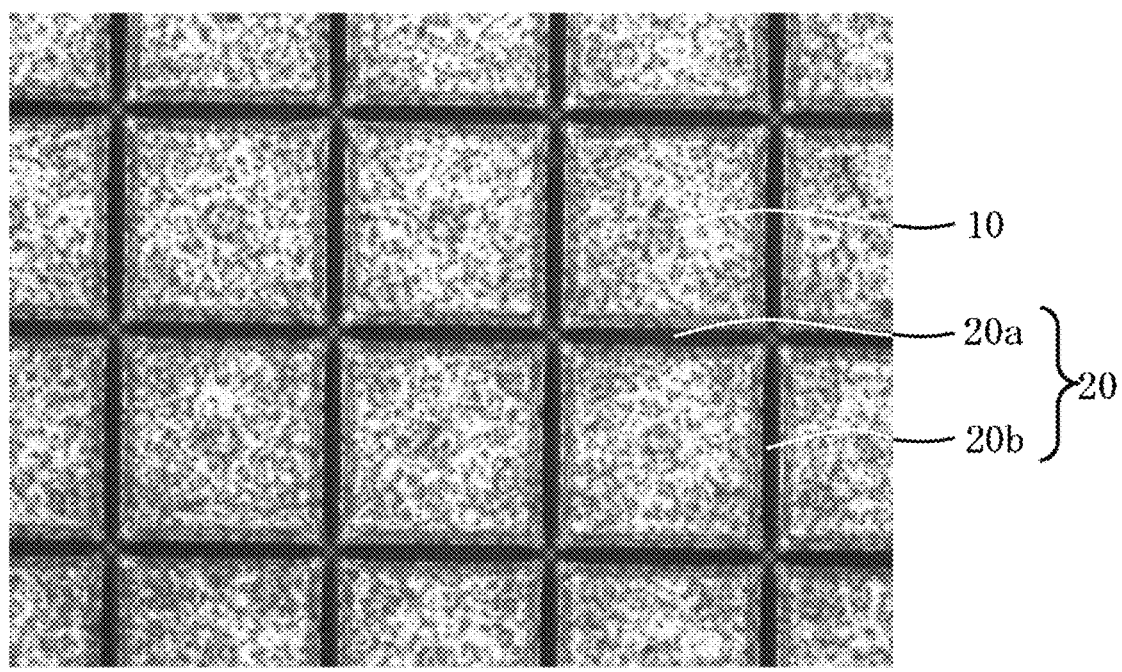
FIG. 9B is an enlarged view of a portion of the plurality of LEDs shown in FIG. 9A.

In this manner, the plurality of LEDs 10 arranged in rows and columns above the substrate 40 as shown in FIG. 9A was formed. FIG. 9B is an enlarged view of a portion of the plurality of LEDs 10 shown in FIG. 9A. The LEDs 10 are arranged in thirty-two rows and eight columns. Each of the LEDs 10 has a substantially rectangular peripheral shape with each side having a length of 150 μm. Each of row-direction spacing regions 20*a* has a width in the column direction of 8 μm, and each of column-direction spacing regions 20*b* has a width in the row direction of 8 μm.

Further, a wiring structure that allows operation in a passive matrix configuration is arranged with respect to the plurality of LEDs 10, so that turn-on of the plurality of LEDs 10 can be individually controlled.

Figure 10A:
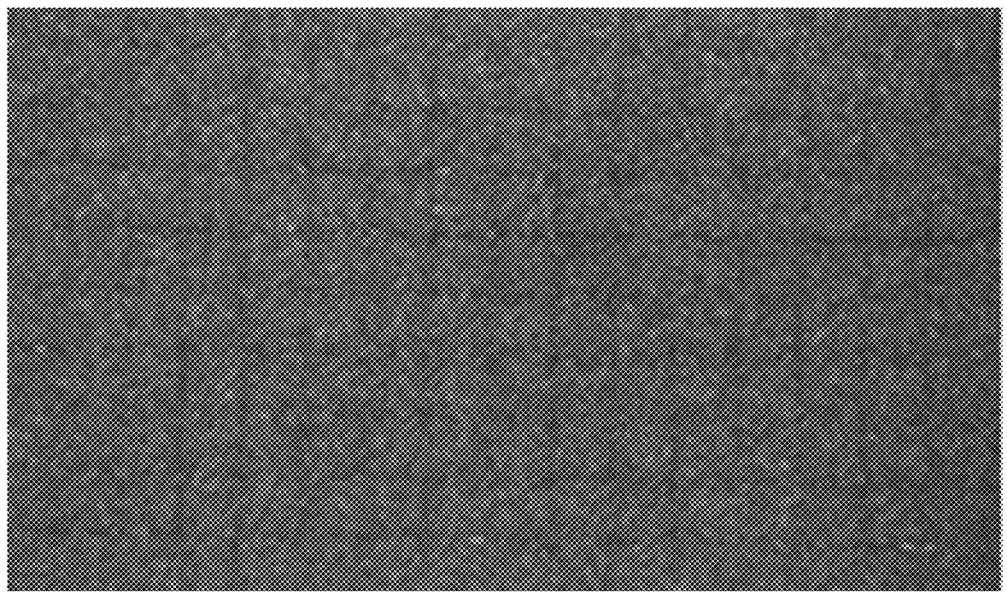
FIG. 10A is an image showing a wavelength converting member of a light emitting device according to one example.
Figure 10B:
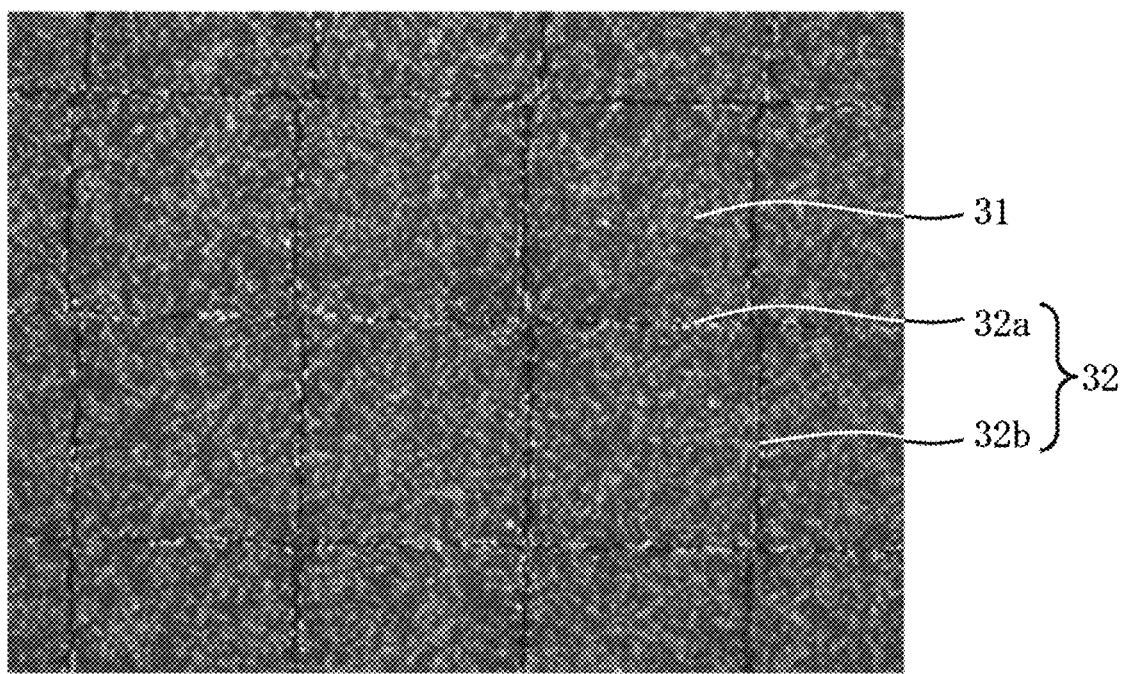
FIG. 10B is an enlarged view of a portion of the wavelength converting member shown in FIG. 10A.

Next, as shown in FIG. 10A, a wavelength converting member 30 was provided. FIG. 10B is an enlarged view of a portion of the wavelength converting member 30 shown in FIG. 10A. In the wavelength converting member 30, a plurality of fluorescent portions 31 is arranged in rows and columns. A light-shielding portion 32 having a lattice shape is arranged between the rows and columns of the fluorescent portions 31. The fluorescent portions 31 contains a YAG-based fluorescent material, and thus the fluorescent portions 31 generally appear yellow, but the fluorescent portions 31 in FIGS. 10A and 10B appear dark green due to the condition when the microscope images were captured. For details of a method of forming the wavelength converting member 30, see Japanese Unexamined Patent Publication No. 2016-219794.

Each of the fluorescent portions 31 has a substantially rectangular peripheral shape with each side having a length of 150 μm. Each of the row-direction light-shielding regions 32*a* has a width in the column direction of 8 μm, and each of the column-direction light-shielding regions 32*b* has a width in the row direction of 8 μm.

Figure 11:
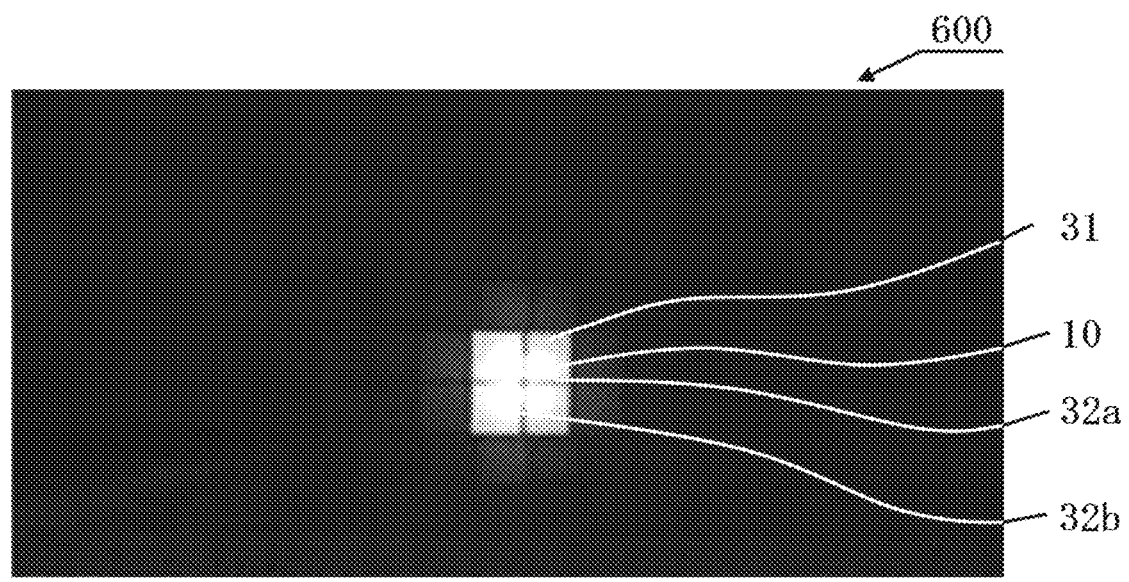
FIG. 11 is an image showing a state where a light emitting device according to one example emits light.

Subsequently, as shown in FIG. 11, the plurality of LEDs 10 are bonded with the wavelength converting member 30 so that each of the row-direction light shielding regions 32*a* is located directly above a corresponding one of the rows of the LEDs 10*a*, each of the column-direction light shielding regions 32*b* is located directly above a corresponding one of the columns of the LEDs 10*b*, each of the row-direction spacing regions 20*a* is located directly below a corresponding one of the rows of the fluorescent portions 31*a*, and each of the column-direction spacing regions 20*b* is located directly below a corresponding one of the columns of the fluorescent portions 31*b*. Thus, a light emitting device 600 was obtained.

For a material used for bonding the plurality of LEDs 10 with the wavelength converting member 30, a silicone resin was employed. A light-reflective filler material was contained in the silicone resin. This arrangement allows to provide a light-reflective filler between adjacent LEDs 10 and between the plurality of LEDs 10 and the wavelength converting member 30. Spacing regions provided between adjacent LEDs 10 allows for a comparatively large amount of the reflective filler to be present between the LEDs 10, but a comparatively small amount of the reflecting filler is allowed to be present between the LEDs 10 and the wavelength converting member 30, because the LEDs 10 and the wavelength converting member 30 are bonded to each other. With this arrangement, light advancing from the LEDs 10 toward adjacent ones of the LEDs 10 is reflected by the light-reflective filler, while light advancing from the LEDs 10 toward the wavelength converting member 30 is not easily reflected. Accordingly, the light emitting device 600 exhibits an improvement in the light extraction efficiency.

FIG. 11 shows a state where one of the LEDs 10 is turned on. As shown in FIG. 11, in the light emitting device 600, a portion of each of four fluorescent portions 31 were arranged above each of the LEDs 10. With such a design, the number of the fluorescent portions 31 located directly above each of the LEDs 10 is not easily varied even with a mounting error of the wavelength converting member 30 and/or variance in the size of the fluorescent portions 31, thus allowing the arrangement of a portion of each of four fluorescent portions 31 above each of the LEDs 10. Accordingly, controlling of lighting appearance in response to turning-on and turning-off pattern of the light emitting device 600 as designed becomes realized.

Further, upon turning-on one of the plurality of LEDs 10, four fluorescent portions 31 above the turned-on LED 10 mainly emitted light. The light-shielding portion 32 was disposed surrounding each of the four fluorescent portions 31, which allows shielding of light from the LEDs 10 by the light-shielding portion 32, so that comparatively little emission was observed from the fluorescent portions 31 other than the four fluorescent portions 31. Accordingly, when predetermined one or more of the LEDs 10 were turned on, four fluorescent portions 31 arranged above respective one the turned-on LEDs 10 were mainly allowed to emit light, thus facilitating control of lighting appearance in response to turn-on/turn-off pattern of the light emitting device 600.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a plurality of LEDs arranged in rows and columns; and
   a wavelength converting member above the plurality of LEDs, the wavelength converting member comprising:
      a plurality of fluorescent portions arranged in rows and columns, and
      a light shielding portion between the plurality of fluorescent portions;
   wherein, in a top view, a first fluorescent portion among the plurality of fluorescent portions overlaps first and second adjacent LEDs among the plurality of LEDs.

2. The light emitting device according to claim 1, wherein, in the top view, a center of the first LED overlaps the light shielding portion.

3. The light emitting device according to claim 2, wherein, in the top view, a center of the second LED overlaps the light shielding portion.

4. The light emitting device according to claim 1, further comprising:
   a plurality of light shielding layers, each covering a lateral surface of a respective one of the plurality of LEDs.

5. The light emitting device according to claim 1, further comprising:
   a wiring structure configured such that the plurality of LEDs are individually controllable using a passive matrix configuration.

6. The light emitting device according to claim 5, further comprising:
   a substrate comprising the wiring structure.

7. The light emitting device according to claim 1, wherein:
   when viewed from above the plurality of LEDs, a part of the light-shielding portion surrounds an outer periphery of the plurality of LEDs.

8. The light emitting device according to claim 1, wherein the light shielding portion is lattice-shaped.

9. The light emitting device according to claim 1, wherein:
   the first and second LEDs are adjacent to each other in a row direction;
   a third LED among the plurality of LEDs is adjacent to the first LED in a column direction;
   a distance between the first LED and the second LED is 50 μm or less; and
   a distance between the first LED and the third LED is 50 μm or less.

10. The light emitting device according to claim 1, wherein:
    each of the plurality of LEDs has a width of 200 μm or less in a row direction, and has a width of 200 μm or less in a column direction.

11. The light emitting device according to claim 1, wherein:
    a second fluorescent portion among the plurality of fluorescent portions is adjacent to the first fluorescent portion in a row direction;
    a third fluorescent portion among the plurality of fluorescent portions is adjacent to the first fluorescent portion in a column direction;
    a distance between the first fluorescent portion and the second fluorescent portion is 50 μm or less; and
    a distance between the first fluorescent portion and the third fluorescent portion is 50 μm or less.

12. The light emitting device according to claim 1, wherein:
    each of the plurality of fluorescent portions has a width of 200 μm or less in the row direction, and has a width of 200 μm or less in the column direction.

* * * * *